United States Patent

Sevenhans et al.

[11] Patent Number: 5,563,599
[45] Date of Patent: Oct. 8, 1996

[54] ANALOG-TO-DIGITAL CONVERTER WITH CASCADED SWITCHING CONTROL OF VOLTAGE DIVIDER SUBSTAGES

[75] Inventors: Joannes M. J. Sevenhans, Brasschaat; Dorine M. E. Gevaert, Oostende; Jozef K. C. Vanneuville, Nieuwpoort, all of Belgium

[73] Assignee: Alcatel N.V., Amsterdam, Netherlands

[21] Appl. No.: 72,772

[22] Filed: Jun. 3, 1993

[30] Foreign Application Priority Data

Jun. 3, 1992 [EP] European Pat. Off. ............. 92201595

[51] Int. Cl.$^6$ ........................................ H03M 1/14
[52] U.S. Cl. ............................ 341/156; 341/159
[58] Field of Search .................. 341/156, 159, 341/158, 160, 155

[56] References Cited

U.S. PATENT DOCUMENTS

| | | | |
|---|---|---|---|
| 4,008,468 | 2/1977 | Imhoff et al. | 341/156 |
| 4,542,370 | 9/1985 | Yamada et al. | 341/156 |
| 4,571,574 | 2/1986 | Krynicki | 341/158 |
| 4,602,241 | 7/1986 | Dingwall | 341/160 |
| 4,749,984 | 6/1988 | Prost et al. | 341/156 |
| 5,066,954 | 5/1991 | Bürgel et al. | 341/158 |
| 5,327,135 | 7/1994 | Hosotani et al. | 341/156 |

FOREIGN PATENT DOCUMENTS

| | | |
|---|---|---|
| 0070175 | 1/1983 | European Pat. Off. . |
| 0262664 | 4/1988 | European Pat. Off. . |
| 0391125 | 10/1990 | European Pat. Off. . |
| 2598572 | 11/1987 | France . |

OTHER PUBLICATIONS

"Session 1: Data Converters—WAM 1.2: a CMOS 40 MHz 8b 105 mW Two–Step ADC", M. Ishikawa et al, *Proceedings of the IEEE International Solid–State Circuits Conference*, Feb. 15, 1989, pp. 14–18.

"Session 1: Data Converters—WAM 1.2: A CMOS 40MHz 8b 105mW Two–Step ADC", N. Fukushima et al, *Proceedings of the IEEE International Solid–State Circuits Conference*, Feb. 15, 1989, New York, pp. 14–15.

*Primary Examiner*—Howard L. Williams
*Attorney, Agent, or Firm*—Ware, Fressola, Van Der Sluys & Adolphson

[57] ABSTRACT

The invention concerns an analog to digital converter (ADC1, ADC2) for converting an analog input voltage (Vin) into a digital output voltage (Dout) in at least two stages, (B1, B2, B3, B1', B2', B3'). The reference voltage (Vref) or part thereof driving a stage is applied to that stage via switching means so that the voltage applied to the latter means is determined when the switching means is set, i.e. the latter voltage is not dependent of the setting of the switching means. Two implementations of the converter are described, one (ADC1) which produces the digital signal (Dout) before another analog voltage (Vin) can be processed, and another (ADC2) which allows another analog voltage (Vin) to be processed by a stage after the output of that stage is produced.

12 Claims, 5 Drawing Sheets

ANALOG-TO-DIGITAL CONVERTER WITH CASCADED SWITCHING CONTROL OF VOLTAGE DIVIDER SUBSTAGES

TECHNICAL FIELD

The present invention relates to an analog to digital converter for converting an analog input voltage to a digital output voltage.

BACKGROUND OF THE INVENTION

Such an analog to digital converter is known in the art, and is e.g. described in "Session 1:Data converters -WAM 1.2:a CMOS 40 MHz 8b 105 mW Two-Step ADC" of the Proceedings of ISCC 89, Feb. 15, 1989, pp. 14–18. Therein a two stage analog to digital converter for converting an analog input voltage into a digital output voltage is described. The two stages are interlaced in such a way that they form a single network of 256 resistors of equal value. The subdivided voltages of the first or coarse stage are taken from the resistor network every sixteenth resistor. This gives 15 voltages which are derived from a reference voltage and compared with the analog voltage by coarse comparators. The result thereof indicates the level of the analog voltage and determines which switches of the switching means are to be closed as well as which sixteen cascaded resistors are used as resistors of the second or fine stage to supply the subdivided voltages of this fine stage.

A disadvantage of this known converter is that the switches connecting the resistors to the comparators of the fine stage are operated at a voltage depending on the level of the analog input voltage since the choice of which cascaded resistors constitute the fine stage is dependent upon the analog input voltage. As a consequence and because the switches have a series resistance depending on the voltage they are operated at, the resistance introduced in the fine stage by the switches depends on the analog voltage, and thereby introduces linearity errors.

DISCLOSURE OF THE INVENTION

An object of the invention is to provide a converter of the above type but which does not have the above mentioned drawback.

This object is achieved due to the fact that for at least one of said stages and via said switching means said input voltage is applied over a predetermined number of substages of said one stage which are selected under the control of said analog voltage, said input control voltage being independent from said selection.

In this way, the input voltage of said one stage is determined when the part of the switching means connecting this one stage to the prior stage is to be set. Hence, the resistance introduced by that part of the switching means becomes independent of the setting of the latter part, unlike the prior art where the input voltage of a stage, being the voltage applied to the part of the switching means connecting that stage to the prior stage depends on the setting of the latter part and, hence, also the series resistance introduced depends on the setting of the latter part. Thereby the linearity errors become lower with respect to the prior art.

Another characteristic of the invention is that for each one of said stages, the first one excepted, said input control voltage is constituted by an output control voltage produced over a substage of the stage preceding said one stage.

Thereby each next stage subdivides the reference voltage further with respect to the prior stage.

A further characteristic of the invention is that for each two consecutive stages, the second stage thereof constitutes the substage of the first stage over which said output control voltage of said first stage is produced.

In this way less components are used for the converter.

Still another characteristic of the invention is that said one stage is said first stage.

Thereby, the reference voltage is applied to the first stage via the switching means, which means that the voltage applied to the part of the switching means included in the first stage is fixed and known and, hence, the voltage drop over the switching means is independent of the analog voltage. In this way linearity errors are no longer present. It is to be noted that a gain error and an offset error are still present. However, such errors do not affect the linearity of the converter.

Another feature of the invention is that each of said stages includes a logic part, which is part of said logic means, and an output of which is one of said subsequent parts of said digital output voltage, in that each but said first stage includes a switching part, which is part of said switching means, and in that, for each but said last stage, said output of said logic part controls said switching part of each next stage.

In this way, each stage is an autonomous item, i.e. the stages only interchange control signals and, e.g., no analog voltages. Thereby, the stages being less dependent upon each other, the design of the converter becomes easier.

A further feature of the invention is that for each of said stages, said logic part is controlled by the voltages at junction points of those substages corresponding to said output substage of the prior stage, the latter substages for said first stage being constituted by all of the substages thereof.

Each next stage so generates voltage levels, a voltage level being the voltage region in between two subdivided voltages or the reference voltage or the ground, and which constitute finer voltage regions than the voltage levels of the output substage of the prior stage. Thereby a better resolution is obtained in each subsequent stage.

Still a further feature of the invention is that said analog input voltage is, for each considered stage, so delayed that said outputs of the respective logic parts of the respective prior stages are available when said analog input voltage is applied to said considered stage.

In this way, while the control information from a stage, controlling the switches of a next stage, allows the latter stage to process the analog signal, the former stage already processes another analog signal. Thereby the conversion speed is no longer limited by the number of stages but becomes substantially equal to the conversion speed of one stage.

Yet a further feature of the invention is that each of said subsequent parts of said digital signal forthcoming from said respective stages is constituted by a predetermined number of bits.

Each stage indeed provides a number of voltage levels, which corresponds to a predetermined number of bits. The number of levels provided is a power of two and as a result the conversion of the levels to bits can be done per stage instead of integrated with other stages, which again allows an easier design.

The above mentioned and other objects and features of the invention will become more apparent and the invention itself will be best understood by referring to the following description of an embodiment taken in conjunction with the accompanying drawing.

BEST MODE FOR CARRYING OUT THE INVENTION

Figure 1A:
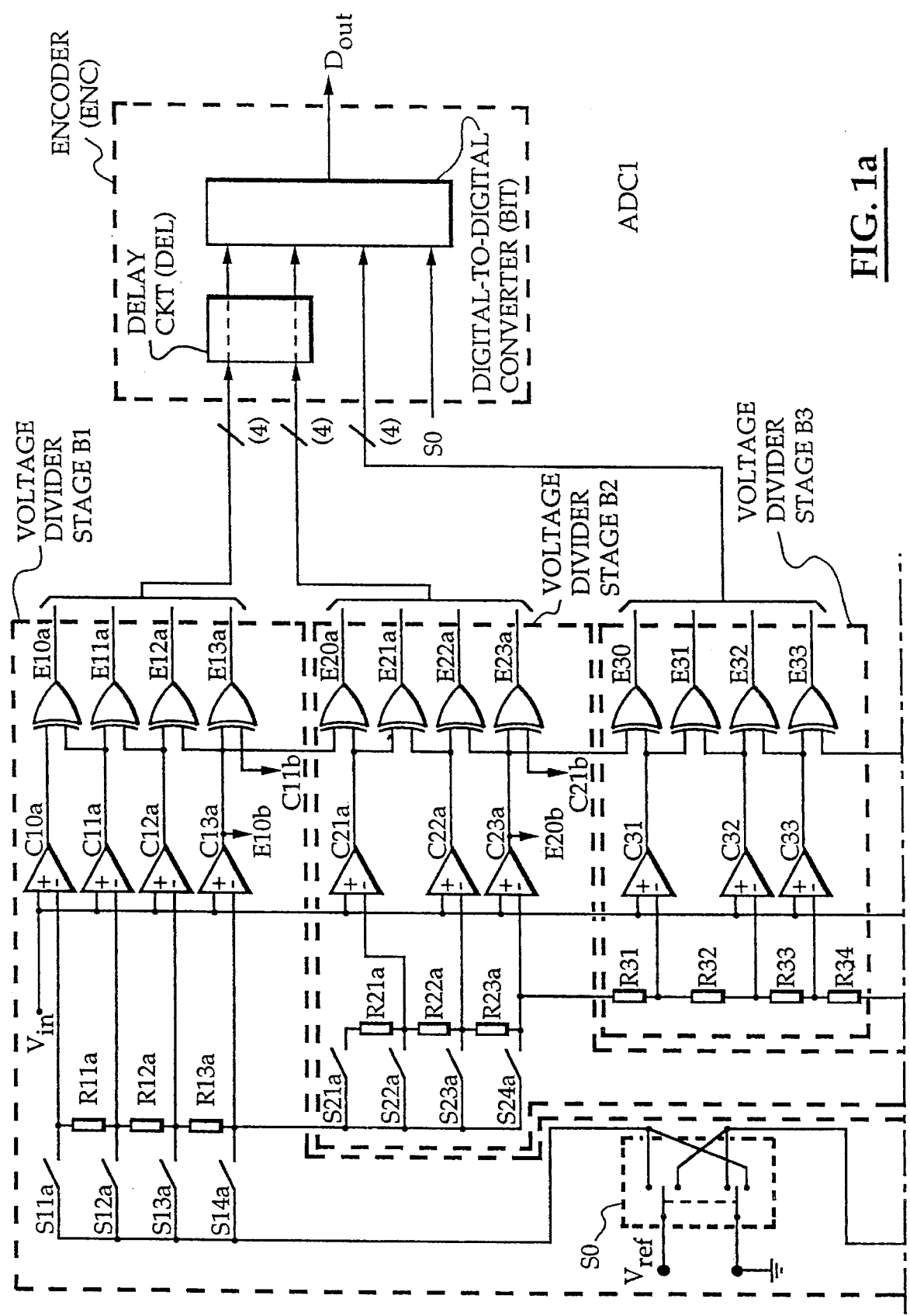
FIG. 1a in connection with FIG. 1b shows a first embodiment of an analog to digital converter ADC1 according to the invention.

The analog to digital converter ADC1 shown in FIG. 1a and b is adapted to convert the amplitude of an analog input voltage Vin to a 6 bit digital output voltage or digital signal Dout. It includes three switching means controlled resistive voltage divider stages B1, B2 and B3 each including a number of substages, each constituted by a resistor. Stage B3 includes four series connected resisters R31 to R34 each having the same value r and constitutes a substage of stage B2. Indeed, B3 is connected in series between two networks of three cascaded resisters R21a to R23a and R21b to R23b forming part of B2 and all having the same value 4r. In its turn stage B2 constitutes a substage of stage B1 and is connected in the same way as stage B3 in series between two networks of three cascaded resisters each, R11a to R13a and R11b to R13b, which oil have the same value 16r and form part of B1.

Figure 1:
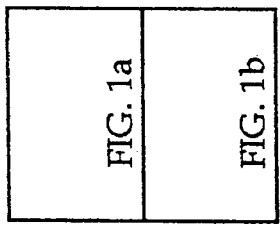
FIG. 1 shows how FIGS 1a and 1b fit together.
Figure 1B:
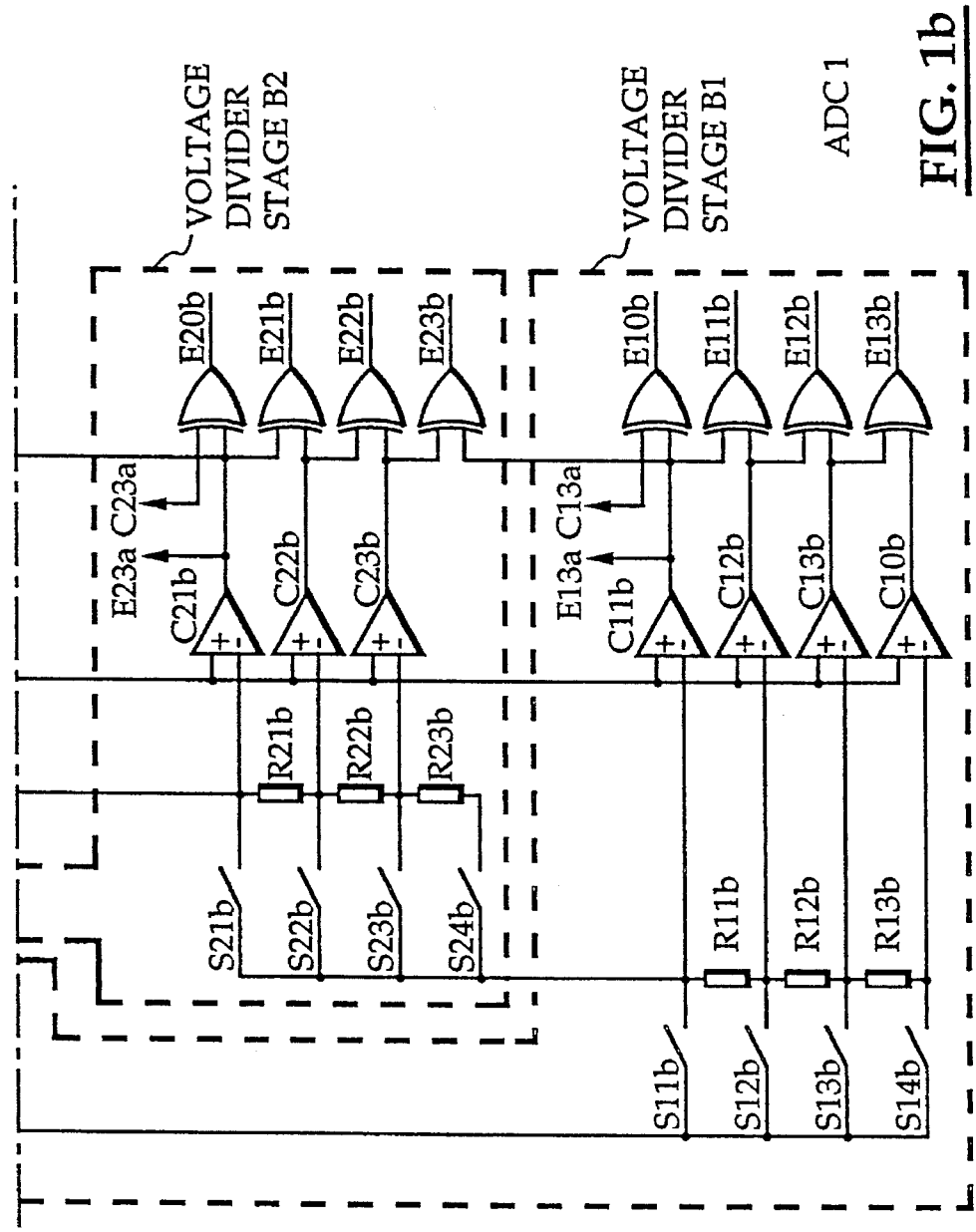

Stages B1 and B2 furthermore include switching means constituted by switches S11a to S14a and S11b to S14b, and S21a to S24a and S21b to S24b respectively, each switch being coupled between one of two inputs of the respective stages and the junction points of the resistors thereof, as shown in FIG. 1. The switching means of stage B1 furthermore includes a so-called double pole double throw switch S0 via which a reference voltage 0, Vref can be applied to the input of stage B1, either normally or reversely poled. All the above switches are in fact constituted by MOSFETs, which are neither shown nor described in detail since they are well known in the art.

Each stage furthermore includes comparators comparing the above analog input voltage Vin which is to be converted to the digital signal Dout, to voltages occurring at the junction points of the resistors of the different stages.

Stage B1 includes comparators C10a to C13a and C10b to C13b; stage B2 includes comparators C21a to C23a and C21b to C23b; and stage B3 includes comparators C31 to C33, all comparators being connected as shown in FIG. 1.

It is to be noted that three of the comparators of stage B1 and three of the comparators of stage B2 are superfluous, as will be explained later, and that two other comparators of stage B1 merely serve to indicate underflow and overflow, respectively, of the analog voltage Vin with respect to the reference voltage Vref, as will also be explained later.

The outputs of the comparators of each stage are applied to a string of logic EXOR gates also included in each stage and which translate the comparator outputs into a four level output, as will be explained later. The outputs of the comparators of stage B1 are applied to EXORs E10a to E13a and E10b to E13b, those of stage B2 to EXORs E20a to E23a and E20b to E23b, and those of stage B3 to EXOR's E30 to E33. All the EXORs are connected as shown in FIG. 1. Again part of the EXORs of stages B1 and B2 are superfluous as will be explained later. It is also noted that EXOR inputs which on FIG. 1 are connected to outputs of comparators which are not provided since they are superfluous or since underflow or overflow control is not a wanted feature, are then connected to a fixed voltage as will be explained later.

The outputs of the EXORs of each stage are applied to buffers, the outputs of the buffers of B1 and B2 controlling the switches of the same stage.

The outputs of the buffers are furthermore applied to an encoder ENC, including the cascade connection of a delay circuit DEL and a digital-to-digital converter circuit BIT. The outputs of the buffers of stage B1 are delayed over two periods, whilst those of B2 are delayed over one period, the delay period corresponding with the delay between applying a voltage to the input of a stage and obtaining the corresponding buffer outputs for controlling the switches of the next stage. The delayed and not delayed buffer outputs are then converted by the digital-to-digital converter BIT, which is e.g. a triple four level to two bit decoder, so obtaining the digital signal Dout.

Figure 2:
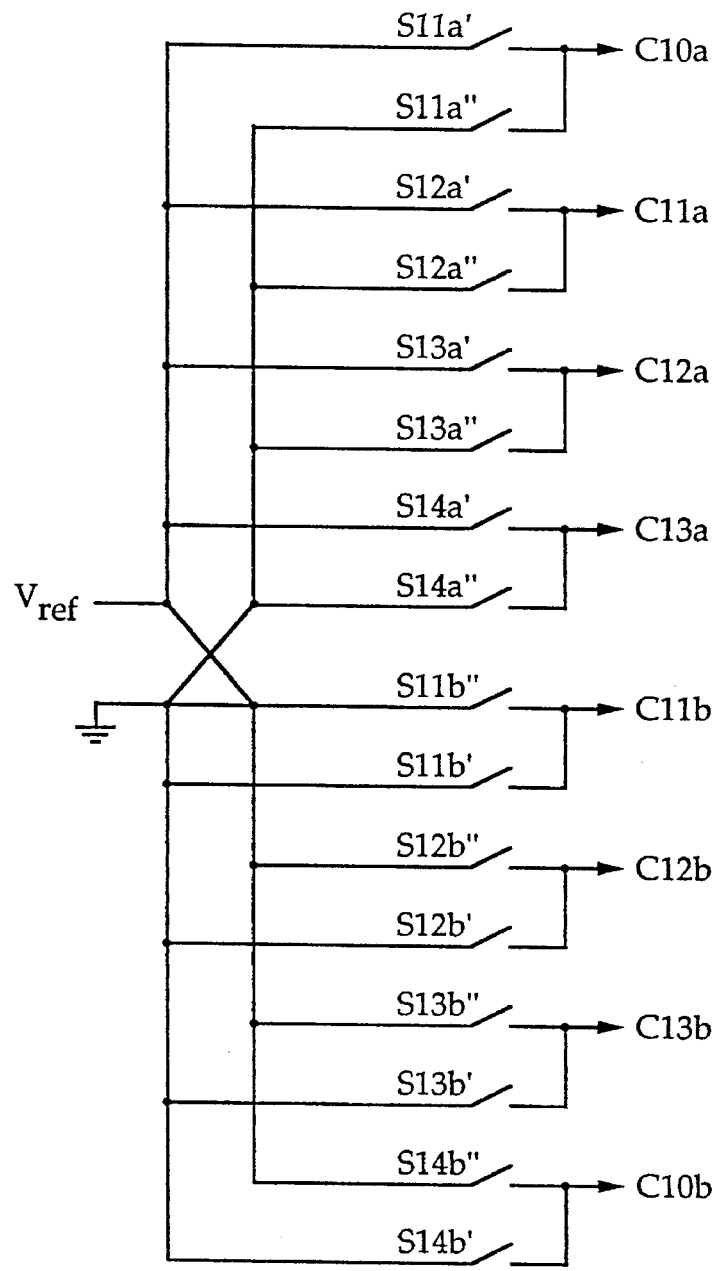
FIG. 2 represents an alternative for the switching means included in the first stage B1 of FIG. 1.

FIG. 2 shows an alternative embodiment of the switching means included in stage B1 and shown in FIG. 1a and b. This embodiment includes MOSFET switches S11a' to S14a', S11a" to S14a", S11b' to S14b', S11b" to S14b" which are each coupled between one of the two inputs of stage B1 and the junction points of the resistors thereof as shown in FIG. 2, In this way the reference voltage 0, Vref can be applied to the resistor network with normal or reversed polarity but via only two switches in series, e.g. S11a' and S11b' or S11a" and S11b" for reversed polarity, instead of four in the case of FIG. 1 (e.g, S11a, S11b and two switches of S0).

This is advantageous since it reduces the parasitic switch resistance, thereby introducing lower gain and offset errors and increasing the converter accuracy.

Figure 3:
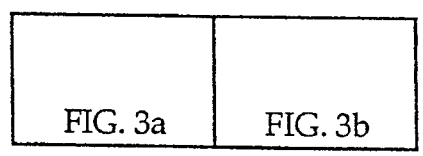
FIG. 3 shows how FIG. 3a and 3b fit together.
Figure 3A:
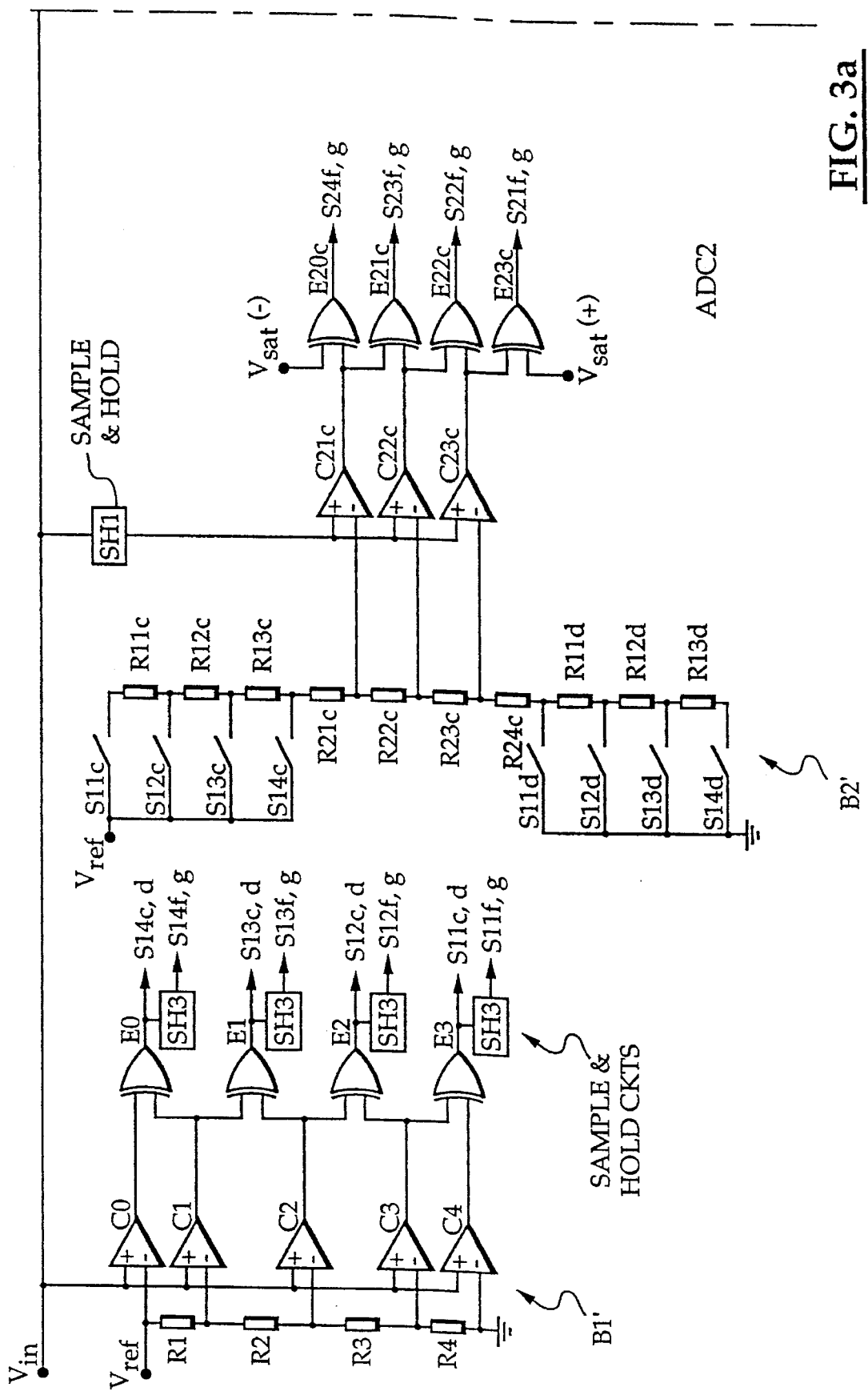
FIG. 3a in connection with FIG. 3b shows a second embodiment of an analog to digital converter ADC2 according to the invention.
Figure 3B:
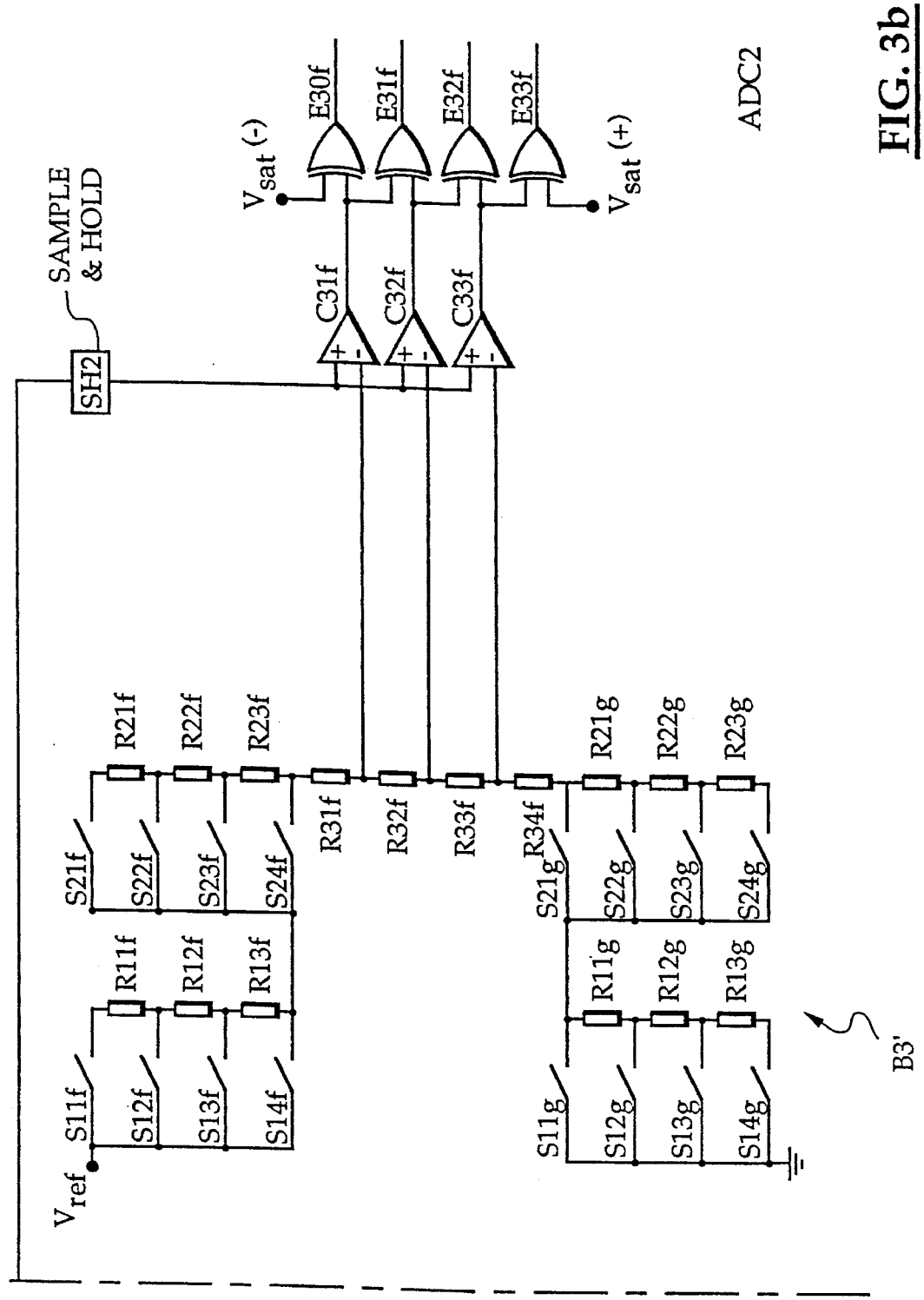

The analog to digital converter ADC2 of FIG. 3 also includes three stages, B1', B2' and B3', each stage here operating as an independent analog to digital converter and being controlled by the output of all prior stages. Stage B1' is a two bit s-called flash analog to digital converter known in the art and built from cascaded resistors R1 and R4 over which the reference voltage 0, Vref is applied, the voltage at each junction point being compared with the analog input voltage Vin by comparators C0 to C4 respectively. The outputs of the comparators C0 to C4 are connected to the inputs of EXORs E0 to E3 respectively.

It is to be noted that comparators C0 and C4 merely serve to indicate overflow and underflow of the analog voltage Vin with respect to the reference voltage Vref respectively, and may be omitted. In this case the EXOR inputs now connected to output of comparator C0 should then be connected to Vsat(+), which is the positive saturation voltage of the comparators, whereas the EXOR input now connected to the output of comparator C4 should then be connected to Vsat(−) which is the negative saturation voltage of the comparators.

Stage B2' is a two stage analog to digital converter of the type shown in FIG. 1 but wherein the comparators of the first stage have been omitted. It is built up from switches S11c to S14c and S11d to S14d, resistors R11c to R13c, R11d to R13d and R21c to R24c, comparators C21c to C23c, and EXORs E20c to E23c respectively. The switches of stage B2' are controlled by the outputs of EXORs E0 to E3 of stage B1'. The analog voltage Vin is applied to the comparators via a a well known sample and hold circuit SH1, which compensates for the delay produced between the instants of applying Vin to stage B1' and operating the switches of stage B2'.

Stage B3' is a three stage analog to digital converter of the type shown in FIG. 1 but wherein the comparators of first and second stage have been omitted. It is built up from switches S11F to S14f, S11g to S14g, S21f to S24f and S21g to S24g, resistors R11f to R13f, F11g to R13g, R21f to R23f, R21g to R23g and R31f to R34f, comparators C31f to C33f, and EXORs E30f to E33f. The switches S11f to S14f and S11g to S14g are controlled by the outputs of EXORs E0 to E3 of stage B1' via a sample and hold circuit SH3, and S21f to S24f and S21g to S24g by the outputs of EXORs E20c to E23c of stage B2'. SH3 provides a delay so that all switches of stage B3' are operated simultaneously. The analog voltage Vin is applied to the comparators via a sample and hold circuit SH2 which compensates for the delay between applying Vin to stage B1' and operating the switches of stage B3'.

The outputs of the EXOR's are all applied to a not shown encoder which is similar to the encoder ENC of FIG. 1 and which encodes the EXOR outputs to a 6-bit digital signal Dout.

The analog to digital converter ADC1 of FIG. 1 operates as follows. When the analog voltage Vin applied to the positive outputs of the comparators is to be converted to the digital signal Dout, first all switches are opened, except for switches S11a, S11b, S21a and S21b. Switch S0 is set to its normal position so that the voltage applied to switch S11a is positive with respect to that applied to switch S11b. In this way the reference voltage VRef is applied to series connected resistors R11a to R13a, R21a to R23a and R31 to R34. The voltages derived from Vref and occurring at the junction points of the resistors are then compared with the analog voltage Vin in the comparators C10a to C13a, C21a to C23a, C31 to C33 and C11b. When Vin is higher than the voltage derived from Vref occurring at the negative input of the comparator, then the comparator output is at Vsat(+) which is the positive saturation voltage of the comparator. On the contrary, when Vin is lower than the derived voltage mentioned, the comparator output is at Vsat(−) which is the negative saturation voltage of the comparator. In this way, the respective comparator outputs show a pattern of a number of successive Vsat(+) followed by a number of successive Vsat(−). By each EXOR string, these saturation voltages are then converted to a logical four level signal, each level being indicated by one of the EXORs and each but one of these levels being 0. The level which is on one indicates the transition from Vsat(+) to Vsat(−) of the corresponding comparators and hence the voltage range in which Vin is located. When for instance the output of EXOR E11a is a logical one, the transition from Vsat(+) to Vsat(−) occurs from comparator C12a to comparator C11a. This means that Vin is lower than the voltage at the junction of resistors R11a and R12a, but higher than that at the junction of R12a and R13a.

When all the outputs of EXORs E10a to E13a are 0, then all outputs of comparators C10a to C13a and C11b are either at Vsat(+) or at Vsat(−). The first case means overflow: Vin is higher than Vref. The second case means underflow: Vin is negative with respect to ground.

The underflow case can be solved by reversing the polarity of Vref by changing the position of switch S0. When the EXORs E10a to E13a then still have an all 0 output, the absolute value of Vin is higher than Vref and can not be converted to a digital value unless as to an all 1 digital output.

It is to be noted that the difference between the first and the second above mentioned case can be made by monitoring the output of one of the comparators C10a to C13a and C11b.

Also, when overflow does not occur Vin is always lower than the voltage at the junction point of switch S11a and resistor R11a, thereby causing comparator C10a always to have an output Vsat(−). Hence, in this case, C10a is superfluous and the input of EXOR E10a normally connected to the output of C10a can be connected to a voltage Vsat(−). An analogous reasoning applies to comparator C11b and EXOR E13a in the case of underflow, the input of E13a normally connected to the output of C11b then being connected to a voltage Vsat(+).

Instead of the four switches chosen above to be closed in a first step, i.e. S11a, S11b, S21a and S21b, four other switches can be chosen. The only imperative here is that for each stage two corresponding switches are closed, i.e. an a-switch and a b-switch of the same numerical index, e.g. S13a and S13b. In that case, other comparators and other EXORs become active, in the example comparators C12a, C13a, C11b to C13b and EXORs E12a, E13a, E11b and E12b, comparator C12a indicating overflow and C13b indicating underflow.

Furthermore, the comparators not used in the first step, i.e. C12b, C13b and C10b in the former example (S21a and S11b closed), or C10a, C11a and C10b in the latter example (S13a and S13b closed), are superfluous, and can therefore be omitted.

The EXOR of stage B1 whose output is a logical one indicates which switches of stage B1 are to be closed in order that the analog voltage Vin should fall within the voltage range applied over the resistors of stage B2. For instance, when the output of E10a is a logical one switches S11a and S11b are opened whereas switches S14a and S14b are closed.

Then, switches S21a and S21b still being closed, the outputs of comparators C21a to C23a are converted to a four level logic signal by EXORs E20a to E23a, the latter signal indicating again the voltage range within which Vin is situated. The EXOR whose output is a logical one again indicates which switches of stage 82 are to be closed. For instance, the output of E22a being a logical one indicates switches S21a and S21b are to be reopened and S22a and S22b are to be closed, thereby causing Vin to fall within the voltage range applied over the resistors of stage Finally, the original output signals of the EXORs of each stage are applied to the encoder ENC, the latter outputs being the ones before the switch settings of the stage itself, but after those of the prior stages were changed, i.e. according to the above example, the outputs of EXOR's E10a to E13a with switches S11a and S11b closed, the outputs of EXORs E20a to E23a with switches S14a and S14b, and S21a and S21b closed, and the outputs of EXORs E30 to E33 with switches S14a, S14b, S22a and S22b closed. In the delay circuit DEL included in ENC, the EXOR output signals of stages B1 and B2 are delayed over such a time value that the the EXOR outputs are simultaneously applied to the converter BIT included in encoder ENC. The digital-to-digital converter BIT converts the three four level signals from the EXORs to a 6 bit digital output signal Dout.

The position of switch S0 is indicative of the polarity of the analog voltage Vin, thereby providing a sign bit and hence giving a seven bit analog to digital converter instead of a six bit one.

It is to be noted that when the switching means of FIG. 2 is used for stage B1, the polarity or sign bit information is indicated by whether a one or double accent switch, i.e. e.g. S11a' and S11b' or S11a" and 511b", is closed.

The analog to digital converter ADC2 operates in a similar way. In the first or coarse stage B1' the four most significant levels and hence the two most significant bits of the digital signal Dout are determined. The EXOR whose output is a logical one indicates which switches of stage B2' are to be closed and which of stage B3', e.g. the output of EXOR E3 being one indicates S11c and S11d, and S11f and S11g are to be closed. Then the two next bits of Dout are determined by stage B2'. By the sample and hold circuit SH1 Vin is delayed over such a time value that it is applied to B2 just after the switches of stage B2' are set. The EXORs of B2' also control switches of stage B3', e.g. the output of EXOR E20c being one indicates switches S24f and S24g are to be closed. Here the sample and hold circuits SH2 and SH3 delay Vin and the outputs of the EXORs of B1' respectively over such time values that they are applied to stage B3' when the outputs of the EXORs of B2' are present.

The output signals of the EXORs of the three stages are then converted in a not shown encoder ENC similar to the one of FIG. 1 to a 6 bit digital signal Dout, the output signals of the EXORs of B1' and B2' being so delayed that all outputs are simultaneously presented to the encoder ENC. Due to the presence of the above mentioned delays it is clear that while the analog voltage Vin is being treated, for instance in stage B2', another analog voltage can already be treated in stage B1'. Thereby the number of stages has substantially no effect on the overall conversion speed of ADC2. Indeed, the latter conversion speed is equal to or only slightly higher than that of a one stage analog to digital converter.

It is to be noted that by reversing the polarity of Vref also negative analog voltages Vin can be processed, thereby also enabling the output of an extra sign bit. This can be done by a switch analogous to switch 50 of FIG. 1. The polarity of the reference voltage Vref is then to be reversed for all stages.

While the principles of the invention have been described above in connection with specific apparatus, it is to be clearly understood that this description is made only by way of example and not as a limitation on the scope of the claimed invention.

Similarly, although the invention has been shown and described with respect to a best mode embodiment thereof, it should be understood by those skilled in the art that the foregoing and various other changes, omissions and additions in the form and detail thereof may be made therein without departing from the spirit and scope of the invention.

We claim:

1. An analog to digital converter (ADC1, ADC2) for converting an analog input voltage (Vin) to a digital output voltage (Dout), comprising:

at least two voltage divider stages (B1, B2, B3, B1', B2', B3') each of which includes a plurality of substages;

cascaded first and second switching means for controlling the series connection of said substages, each of said voltage divider stages being responsive to an input voltage for providing subdivided voltages, said input voltages being subdivided into said subdivided voltages by said substages which are connected in series by said switching means, a first voltage divider stage (B1, B1') of said voltage divider stages being responsive to an input voltage which is a predetermined reference voltage (Vref);

logic means responsive to said subdivided voltages and to said analog input voltage (Vin) for providing parts of said digital output voltage (Dout); and buffer means responsive to said parts of said digital output voltage for controlling said switching means for connecting in series selected substages of at least one of said voltage divider stages.

2. An analog to digital converter (ADC1) according to claim 1 wherein for each one of said voltage divider stages (B2, B3), except for said first voltage divider stage, said input voltage is provided by an output voltage, said output voltage being provided by a substage of a preceding voltage divider stage of said voltage divider stages.

3. An analog to digital converter (ADC1) according to claim 2 wherein said output voltage is provided by a fixed substage of said preceding voltage divider stage.

4. An analog to digital converter according to claim 2 wherein for each two consecutive voltage divider stages, a second one of said two consecutive voltage divider stages provides said output voltage for a first one of said two consecutive voltage divider stages.

5. An analog to digital converter according to claim 1 wherein said at least one of said voltage divider stages is said first voltage divider stage.

6. An analog to digital converter (ADC2) according to claim 1, wherein each of said voltage divider stages includes a logic part, which is part of said logic means, an output of each of said logic parts being one of said parts of said digital output voltage (Dout), wherein each of said voltage divider stages except for said first voltage divider stage includes a switching part, which is part of said switching means, and wherein, for each of said voltage divider stages except for a last voltage divider stage, said output of said logic part controls said switching part of a subsequent voltage divider stage of said voltage divider stages.

7. An analog to digital converter (ADC2) according to claim 6, wherein for each of said voltage divider stages, said logic part is controlled by voltage signals at each junction point between series connected substages corresponding to an output substage of said preceding voltage divider stage, said output substage for said first voltage divider stage being constituted by all of the substages thereof.

8. An analog to digital converter (ADC2) according to claim 6, wherein said analog input voltage (Vin) is, for a current voltage divider stage of said voltage divider stages, so delayed that said outputs of each respective logic part of each respective preceding voltage divider stage is available when said analog input voltage (Vin) is applied to said current voltage divider stage.

9. An analog to digital converter (ADC1, ADC2) according to claim 1, wherein each of said substages is a resistor.

10. An analog to digital converter (ADC1, ADC2) according to claim 1, wherein said switching means includes switches each constituted by a transistor.

11. An analog to digital converter (ADC1, ADC2) according to claim 1, wherein said logic means includes comparators for comparing said analog input voltage (Vin) to said subdivided voltages, and an encoder means for encoding outputs of said comparators into said digital output voltage (Dout).

12. An analog to digital converter (ADC1, ADC2) according to claim 1, wherein each of said parts of said digital output voltage (Dout) comprise a predetermined number of bits.

* * * * *